(12) United States Patent
Paci et al.

(10) Patent No.: US 8,736,262 B2
(45) Date of Patent: May 27, 2014

(54) INTEGRATED MAGNETIC SENSOR FOR DETECTING VERTICAL MAGNETIC FIELDS AND MANUFACTURING PROCESS THEREOF

(75) Inventors: Dario Paci, Leghorn (IT); Caterina Riva, Cusago (IT); Marco Morelli, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 478 days.

(21) Appl. No.: 13/021,573

(22) Filed: Feb. 4, 2011

(65) Prior Publication Data

US 2011/0193556 A1    Aug. 11, 2011

(30) Foreign Application Priority Data

Feb. 5, 2010    (IT) .......................... TO2010A 000083

(51) Int. Cl.
*G01R 33/07* (2006.01)
(52) U.S. Cl.
USPC ........................................................ 324/251
(58) Field of Classification Search
USPC ........................................................ 324/251
See application file for complete search history.

(56) References Cited

U.S. PATENT DOCUMENTS

| | | | |
|---|---|---|---|
| 4,772,929 A | 9/1988 | Manchester | |
| 5,942,895 A | 8/1999 | Popovic et al. | |
| 6,341,080 B1 * | 1/2002 | Lienau et al. | 365/66 |
| 6,356,068 B1 | 3/2002 | Steiner et al. | |
| 6,396,114 B1 | 5/2002 | Yoshinaga | |
| 6,404,192 B1 | 6/2002 | Chiesi et al. | |
| 6,545,462 B2 | 4/2003 | Schott et al. | |
| 2002/0017902 A1 | 2/2002 | Vasiloiu | |
| 2003/0112158 A1 | 6/2003 | Babin | |
| 2003/0207486 A1 | 11/2003 | Deak | |
| 2004/0008022 A1 | 1/2004 | Viola et al. | |
| 2006/0175674 A1 | 8/2006 | Taylor et al. | |
| 2010/0134101 A1 | 6/2010 | Riva et al. | |
| 2010/0156405 A1 | 6/2010 | Furukawa et al. | |

FOREIGN PATENT DOCUMENTS

JP    2000-340856 A    12/2000

OTHER PUBLICATIONS

Cui, Z. et al., "Fabrication of magnetic rings for high density memory devices," Microelectronic Engineering 61-62:577-583, Jul. 1, 2002.
Drljaca, P. et al, "Design of planar magnetic concentrators for high sensitivity Hall devices," Sensors and Actuators A 97-08:10-14, Apr. 1, 2002.
Baschirotto, A. et al., "An Integrated Micro-Fluxgate Magnetic Sensor With Sputtered Ferromagnetic Core," Proceedings of the IEEE Instrumentation and Measurement Technology Conference, pp. 2045-2049, Apr. 24-27, 2006.

* cited by examiner

*Primary Examiner* — Bot Ledynh
(74) *Attorney, Agent, or Firm* — Seed IP Law Group PLLC

(57) ABSTRACT

An integrated magnetic sensor formed in a body including a substrate of semiconductor material, which integrates a Hall cell. A trench is formed in the body, for example, on the back of the substrate, and is delimited by lateral surface portions that extend in a direction transverse to the main face of the body. The trench has a depth in a direction perpendicular to the main face that is much greater than its width in a direction parallel to the main face of the body, between the lateral surface portions. A concentrator made of ferromagnetic material is formed within the trench and is constituted by two ferromagnetic regions, which are set at a distance apart from one another and extend along the lateral surface portions of the trench towards the first Hall cell.

20 Claims, 8 Drawing Sheets

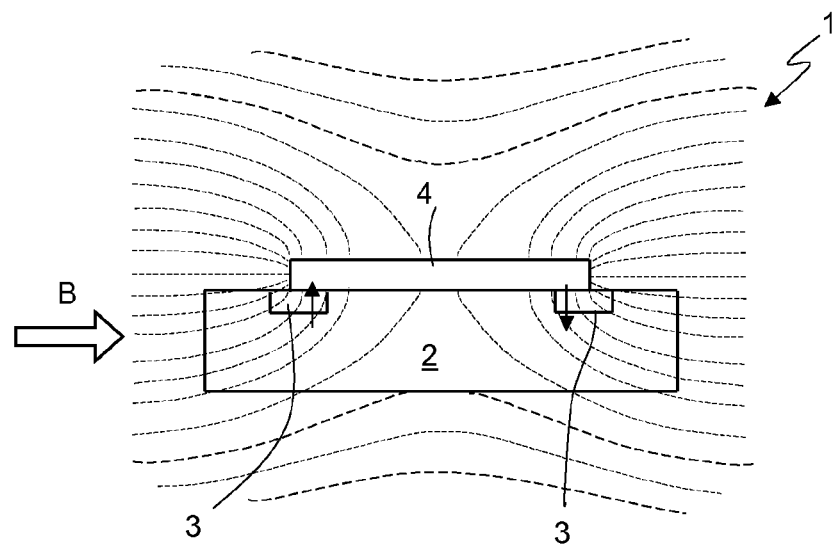
Fig. 1 *(Prior Art)*
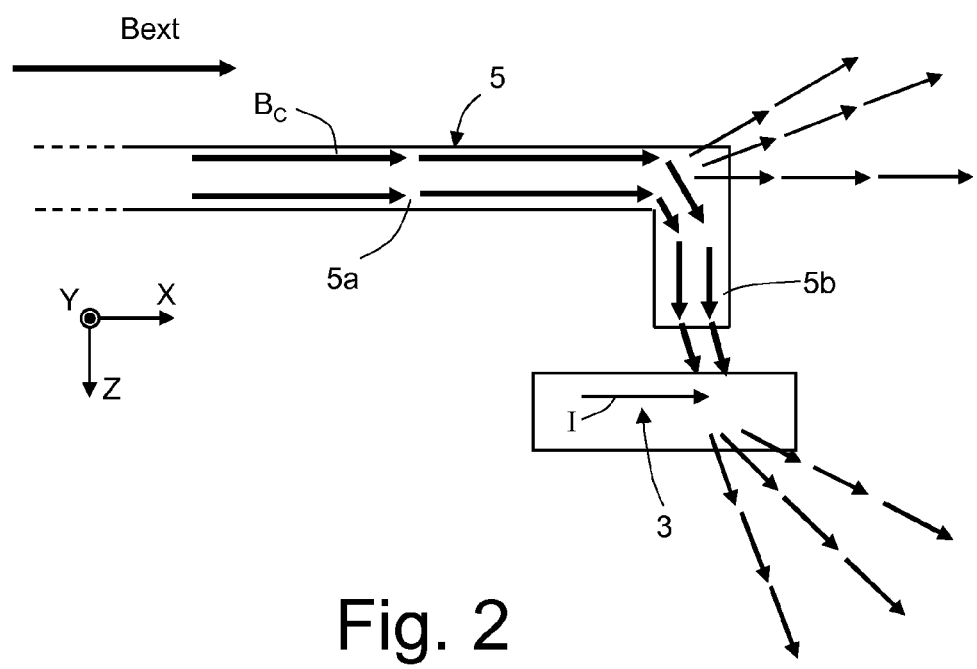
Fig. 2

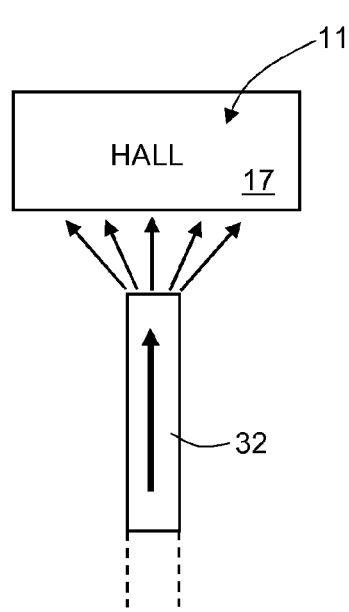
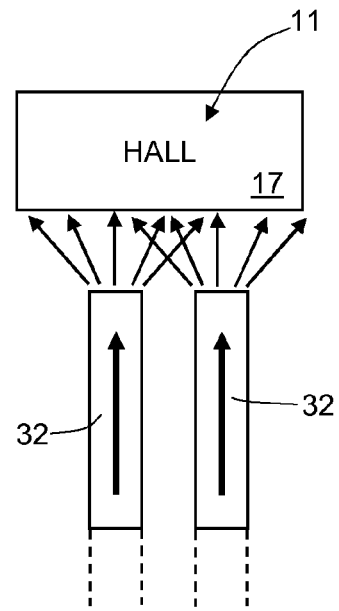
Fig.6a  Fig.6b
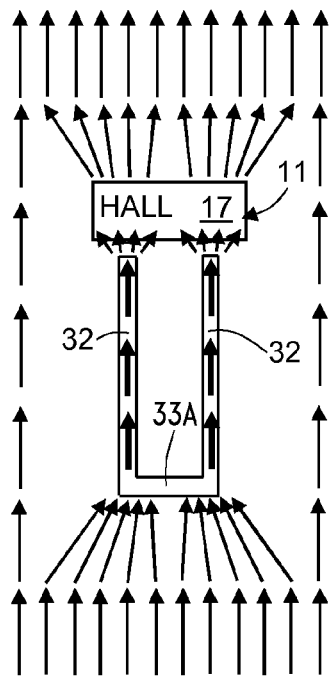
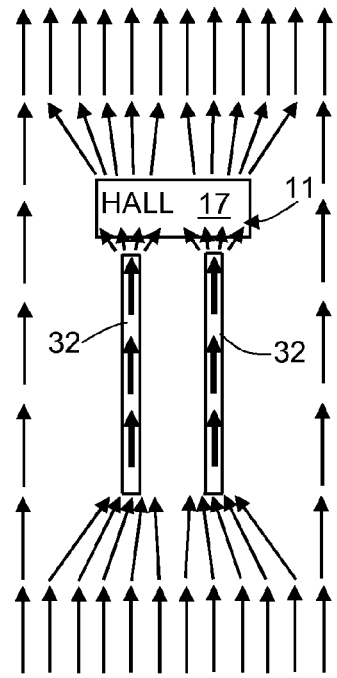
Fig.7a  Fig.7b

INTEGRATED MAGNETIC SENSOR FOR DETECTING VERTICAL MAGNETIC FIELDS AND MANUFACTURING PROCESS THEREOF

BACKGROUND

1. Technical Field

The present disclosure relates to an integrated magnetic sensor for detecting vertical magnetic fields and to the manufacturing process thereof. In particular, the disclosure relates to a Hall-effect sensor able to amplify the components of a magnetic field directed perpendicular to the sensor.

2. Description of the Related Art

As is known, the integration of a thin ferromagnetic layer in a standard CMOS process or a CMOS-compatible process enables producing integrated magnetic-field sensors, such as Fluxgate and Hall-effect sensors, which are able to detect horizontal magnetic fields.

An example of Hall-effect sensor 1 having a concentrator is shown in FIG. 1, wherein a substrate 2 of semiconductor material accommodates a pair of Hall cells 3. A concentrator 4 extends on the surface of the substrate 2, insulated therefrom via an insulation layer (not shown).

The concentrator 4 is formed by a strip of ferromagnetic material, the ends whereof are vertically aligned to a respective Hall cell 3, obtained in a known way and thus not shown in detail. Moreover this figure shows the lines of flux of an external magnetic field B oriented parallel to the surface of the substrate, as deviated by the concentrator so as to traverse the Hall cells 3 in a direction perpendicular to the surface of the substrate. Thus the external field may be detected by the Hall cells, which are in themselves sensitive only to the components of the field perpendicular to the surface.

In practice, the concentrator 4 causes an increase in the sensitivity of the sensor, thanks to the capacity of modifying the lines of flux of the magnetic field and concentrating them in the proximity of the Hall-effect sensors 3.

BRIEF SUMMARY

One embodiment of the present disclosure is a magnetic sensor of the type indicated above, having an increased sensitivity in the direction perpendicular to the plane of the chip.

According to the present disclosure an integrated magnetic sensor for detecting an external magnetic field, and the manufacturing process thereof are provided, as defined in claims 1 and 14, respectively.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIG. 1 shows a cross-section of a chip of semiconductor material, which integrates a known magnetic sensor for detecting horizontal magnetic fields, having a concentrator;

FIG. 2 shows a principle diagram of a magnetic sensor for detection of horizontal magnetic fields with a concentrator having a non-planar structure;

FIGS. 6a and 6b show the evolution of the magnetic field without and with superposition of the effects of the fields concentrated by a number of vertical concentrators;

FIGS. 7a and 7b show the plot of the field in two different embodiments of the present sensor;

DETAILED DESCRIPTION

Figure 3:
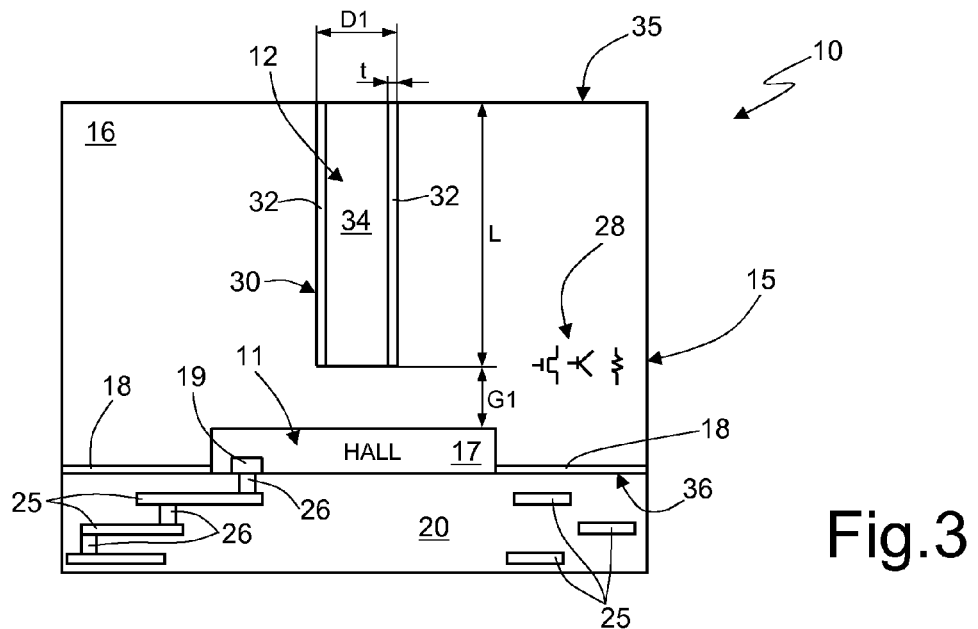
FIG. 3 is a cross-section of a semiconductor chip, which integrates one embodiment of the present magnetic sensor, sensitive to vertical fields.

In order to increase the sensitivity of the sensor of FIG. 1, U.S. patent application Ser. No. 12/957,175, filed on 30 Nov. 2010, teaches a Hall-effect sensor having concentrator having a non-planar structure, which is illustrated schematically in annexed FIG. 2. In detail, the concentrator 5 comprises a planar portion 5a, parallel to the surface of the Hall cell 3, and a tip portion 5b, extending transversely to the planar portion 5a, for example perpendicular to the latter, directed towards the Hall cell 3.

Thereby, in the presence of a field Bext parallel to the plane XY, the concentrator 5 produces a concentrated field Bc in the planar portion and causes bending of the lines of flux along the axis Z in the tip portion 5b, above the Hall cell 3. If this is traversed by a horizontal current I, the component concentrated along the axis Z may be detected by the Hall cell 3.

In the concentrators 4, 5 described above, the amplification operates only on the components of the external field parallel to the surface of the chip that accommodates the Hall cell 3, i.e., in the directions X and Y (FIG. 2). Instead, the concentrator 4 or 5 has practically no effect on the component Z of the field, which is not amplified nor shielded (at least for thicknesses of a few microns of known concentrators).

On the other hand, it would be advantageous to amplify also the component Z, to which the Hall cell 3 is in any case inherently sensitive. This would allow, on the one hand, to increase the sensitivity of a Hall-effect sensor to vertical components of an external magnetic field and, on the other, to obtain a three-dimensional magnetic sensor having a sensitivity, to a first approximation, of the same order of magnitude on each axis. In fact, currently, by using planar or non-planar concentrators it is possible to obtain an amplification of the magnetic field of up to ten times, thus obtaining a difference of one order of magnitude between the sensitivity of the Hall cell 3 sensitive to the directions of the field coplanar to the chip and that of a Hall cell sensitive to the field in a direction perpendicular to the chip.

FIG. 3 shows one embodiment of a Hall-effect sensor 10 sensitive to vertical magnetic fields, comprising a Hall cell 11 and a concentrator 12 integrated in a chip 15.

Here, the chip 15 is monolithic and comprises a substrate 16 of semiconductor material, for example silicon, having a first and a second surfaces 35, 36, whereof the first surface 35 forms a main face of the chip 15. The substrate 16 accommodates the Hall cell 11 formed in a well 17, for example of an $N^-$-type, delimited by a field-insulation region 18, for example of silicon oxide, facing the second surface 36. Pairs of conductive biasing and detection regions 19 (only one whereof is visible) are formed, in a per se known manner, in the well 17.

A dielectric layer 20, for example an oxide layer typically formed by a plurality of layers arranged on top of each other, covers the second surface 36 of the substrate 16 and accommodates various metallization levels. In the example shown, three metallization levels are visible, formed by metallization regions 25 connected, through contacts and metal vias 26, to each other and to the conductive biasing and detection regions 19, in a per se known manner.

Electronic components 28, represented in a schematic way, may be integrated within the substrate 16 or formed above it, in a known way, and be connected in a way not shown to the Hall cell 11, for example, through the metallization regions 25, the contacts, and the metal vias 26.

A trench 30 extends in the substrate 16 from the main face 35, aligned vertically to the well 17. In particular, the trench 30 is formed so as to extend within the ideal right prism having as base the area of the well 17 (bulk of the well 17 in a plane parallel to the main face 35). The vertical walls of the trench are covered by ferromagnetic regions 32 of soft ferromagnetic material (i.e., a material that may be magnetized easily and does not maintain the magnetization after removing the external magnetic field), for example of a cobalt-based amorphous alloy or a permalloy (NiFe). The ferromagnetic regions 32 form the concentrator 12. The trench may have any shape. For example, if the trench 30 has a square/rectangular cross-section, four ferromagnetic regions 32 are present (two of which are visible).

The terms "vertical" and "vertically" are being used herein to refer to a direction substantially perpendicular to the main face 35 of the chip 15, while "horizontal" and "horizontally" are being used to refer to a direction substantially parallel to the main face of the chip. Of course, the orientation of the device incorporating the Hall-effect sensor 10 could be in any direction, such that the "vertical" items discussed herein become oriented non-vertically with respect to the surface of the Earth, and the "horizontal" items become oriented non-horizontally.

The inside of the trench 30 may be filled with dielectric material 34.

At least in one cross-section plane (in the case represented, the plane of the drawing), the trench 30 has a width smaller than the depth. In detail, the trench 30 has a low form ratio D1/L, where D1 is the width of the bottom wall, and L is the height of the vertical walls as well as the length of the ferromagnetic regions 32, which here cover the entire depth of the trench 30. For example, the form ratio D1/L may be equal to 1:30, but form ratios of 1:20, 1:15 or also 1:8 may likewise be adopted. The form ratio D1/L of 1:30 may be obtained, in the case of a substrate 16 having a thickness of 500 µm, with a distance G1 of 15 µm between the bottom of the trench 30 and the active area 17, and a width D1 of the trench of approximately 16 µm. In general, the distance G1 may be as small as possible and range between 5 and 20 µm, e.g. between 8 and 15 µm, and the width D1 of the bottom wall may range between 15 and 30 µm. In this way, with a Hall cell of dimensions 30×30 µm$^2$, both of the ferromagnetic regions 32 visible in the drawing extend above the Hall cell 11, within the volume delimited by the area of the Hall cell 11.

The ferromagnetic material layer that forms the ferromagnetic regions 32 of the concentrator 12 may have a thickness t comprised between 0.5 and 3 µm, for example 1 µm. In this way, in the embodiment shown, the ratio L/t of the ferromagnetic regions 32 is very high and thus the ferromagnetic regions 32 may be easily magnetized when they are subjected to a magnetic field perpendicular to the chip 15 (i.e., a field perpendicular to the surfaces 35 and 36 of the substrate 16), but are hard to magnetize in the presence of a magnetic field parallel to the surface of the chip 15. Consequently, the ferromagnetic regions 32 have a high sensitivity to the vertical components of external magnetic fields and high directional selectivity.

By virtue of the indicated geometry, with the ferromagnetic regions 32 having a length much greater than their thickness and both arranged within the space delimited by the area of the Hall cell 11, the ferromagnetic regions 32 concentrate the vertical components of the magnetic field, i.e., those perpendicular to the main face 35 of the chip 15, on the Hall cell 11. Consequently, this sees a vertical magnetic field, which is amplified and consequently has a sensitivity increased with respect to a similar Hall cell without concentrator 12.

As regards the portions of the ferromagnetic regions 32 that extend outside the drawing plane (for example, in planes parallel thereto), their contribution depends upon the shape and size of the trench 30 in a direction perpendicular to the drawing plane; in particular, these portions not shown contribute to focusing the magnetic field if they are arranged above the well 17.

Figure 4A:
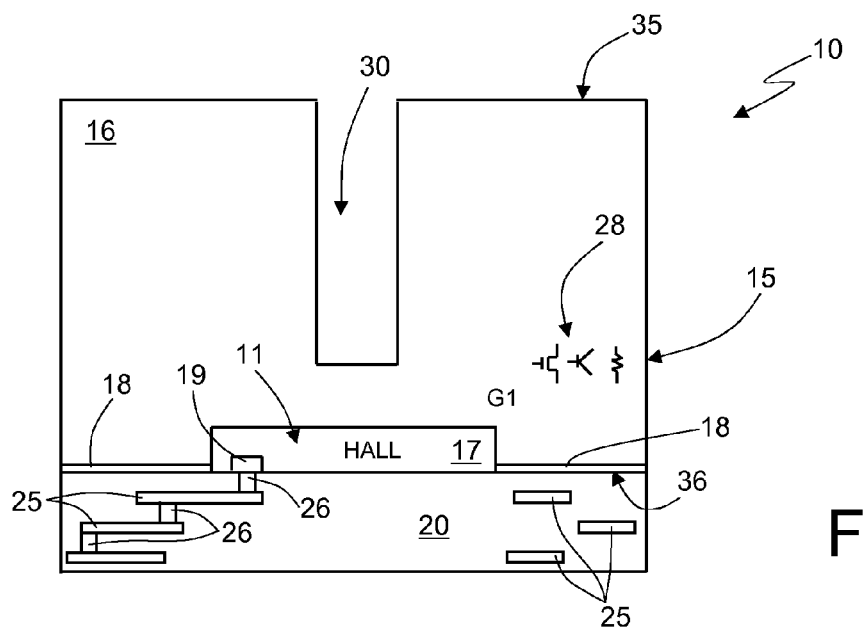
FIGS. 4a-4c show cross-sections similar to those of FIG. 3, in different steps of fabrication of the sensor.
Figure 4B:
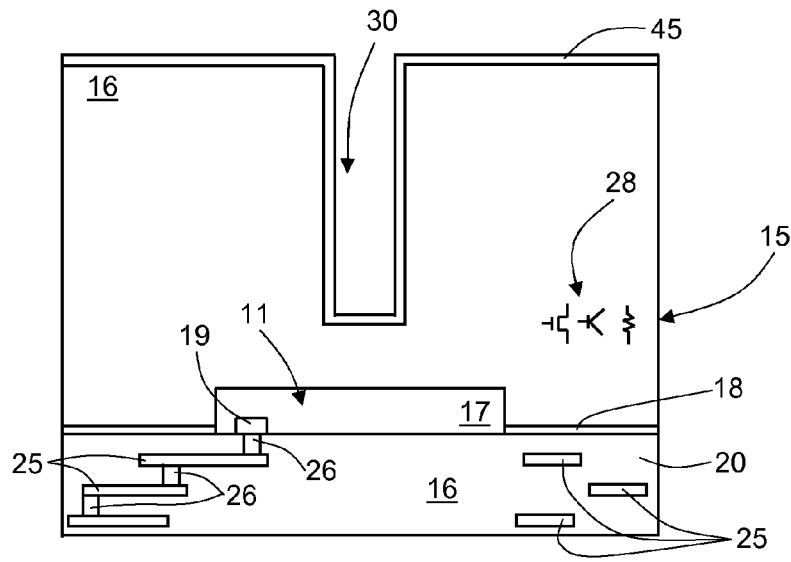
Figure 4C:
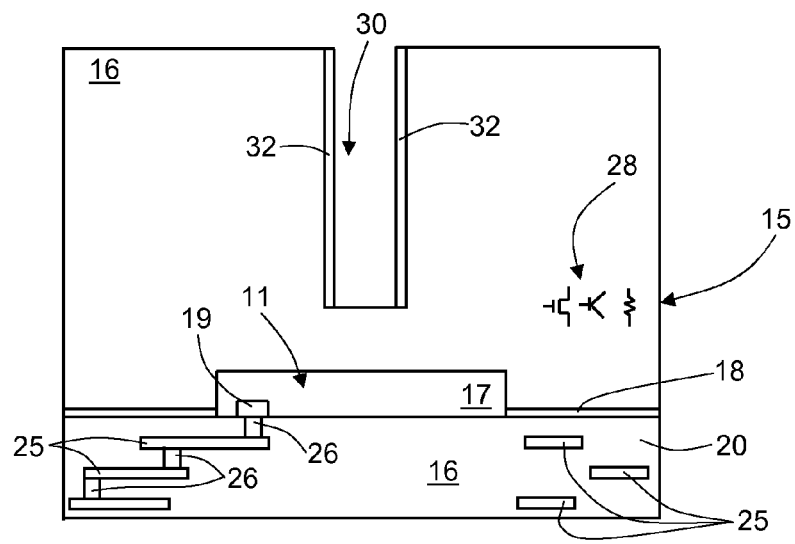

The structure of FIG. 3 may be obtained as shown in FIGS. 4a-4c. Initially (FIG. 4a), after the Hall cell 11, the electronic components 28, the dielectric layer 20, the metallization regions 25, the contacts, and the metal vias 26 have been formed, one or more trenches 30 are formed on the back of the substrate 16, from the main face 35. To this end, a deep reactive ion etching (DRIE) is used. This type of etch enables vertical walls of the trench 30 and the low form ratio D1/L indicated above to be obtained.

Next (FIG. 4b), a ferromagnetic layer 45, of soft ferromagnetic material, is uniformly deposited on the back of the substrate 16, for example by sputtering.

Then, the ferromagnetic layer 45 is defined using a lithographic process so as to eliminate the portions that extend on the main face 35 of the chip 15. For example, for the definition of the ferromagnetic layer 45, a wet etch, a dry etch, or a lift off may be used. In addition, using one of the techniques referred to above, in the case of the solution of FIG. 3, the horizontal portions on the bottom of the trenches 30 are also removed.

Finally, the trenches 30 may be filled with dielectric material 34, deposited, for example, by CVD (Chemical-Vapor Deposition), and the part of the dielectric material 34 projecting from the trench 30 is removed, for example by a CMP (Chemical-Mechanical Polishing) process or a wet etch, to obtain the structure of FIG. 3.

Figure 5:
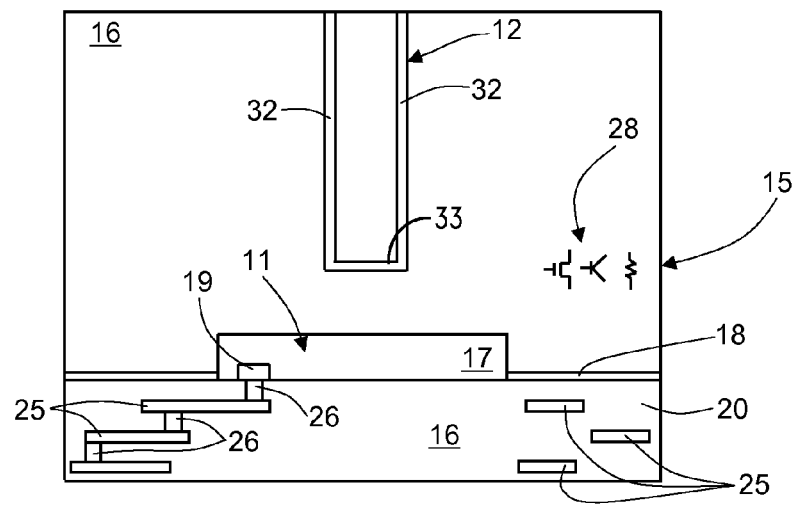
FIG. 5 is a cross-section of a semiconductor chip, which integrates a different embodiment of the present magnetic sensor.

FIG. 5 shows a variant of FIG. 3, wherein the ferromagnetic layer 45 of FIG. 4b is not removed from the bottom of the trench 30 and thus a bottom region 33 covers the bottom of the trench 30 and electrically connects the ferromagnetic regions 32. The bottom region 33 is thus of the same material as the ferromagnetic regions 32 and has the same thickness.

According to another embodiment (not shown), also the horizontal portions of the ferromagnetic layer 45 on the back of the substrate 16 are not removed. In fact, above all in the case of a great length of the ferromagnetic regions 32, these horizontal portions do not substantially interfere with the operation of the vertical sensor 10, even if they are long, because they are far from the sensitive area and the effect of possible horizontal magnetic fields remains localized on the back of the substrate.

The embodiment of FIG. 5 moreover differs from that of FIG. 3 also because the trench 30 is not filled with dielectric material 34.

In both the embodiments of FIGS. 3 and 5, the concentrator 12 acts so as to concentrate the lines of flux of a vertical magnetic field B on the Hall cell 11. In particular, thanks to the closeness of one end of each ferromagnetic region 32 to the Hall cell 11 and to the high form ratio L/t of each ferromagnetic region 32, the lines of field are bent and concentrated within each ferromagnetic region 32 and thus within the underlying Hall cell 11, as shown in FIG. 6a. In this way, an amplification of the magnetic field in the vertical direction detected by the Hall cell 11 is obtained.

The presence of two ferromagnetic regions 32 above a same Hall cell 11 enables a superposition of the field to be obtained, as shown in FIG. 6b. In this way, the concentrator 12 is more effective in the amplification of the field and satisfies the contrasting desires linked to the thickness of ferromagnetic regions 32 of the concentrator 12. In fact, a simple way to increase the effect of concentration on the Hall cell 11 would be to increase the thickness t of a ferromagnetic region 32 so as to enlarge the extension of the area of high magnetic field concentrated on the Hall cell 11, thus constituting a larger flux tube. However, the increase in the thickness of a ferromagnetic region 32 involves a higher demagnetization factor, thus a greater difficulty of magnetization because of the geometry with a lower L/t ratio.

Instead, by providing two or more ferromagnetic regions 32 of a very low thickness t (for example 1 μm), each ferromagnetic region 32 is magnetized easily, and at the same time the area where the concentrated field is high widens, thanks to the above superposition. This enables, i.a., the obtainment of Hall cells 11 of greater area. For example, it is possible to form Hall cells 11 having an area of 45×45 μm$^2$ or even 100×100 μm$^2$ by providing a number of ferromagnetic regions 32, as described in greater detail hereinafter.

With the geometry indicated of the ferromagnetic regions 32, the bottom region 33 has no effect, as emerges clearly by comparing FIGS. 7a and 7b, regarding simulations of magnetic field in presence and in absence of a horizontal region 33A. As may be noted, the magnetic-field lines are practically identical in the two situations. Even though in FIG. 7a the horizontal region 33A is far from the Hall cell 17, the same conclusions may be drawn also when the bottom region 33 is close to the Hall cell 17, by virtue of the existing geometrical ratios.

On the other hand, the embodiment of FIG. 5 is easier to obtain and cheaper, because the bottom region is not removed.

Figure 8:
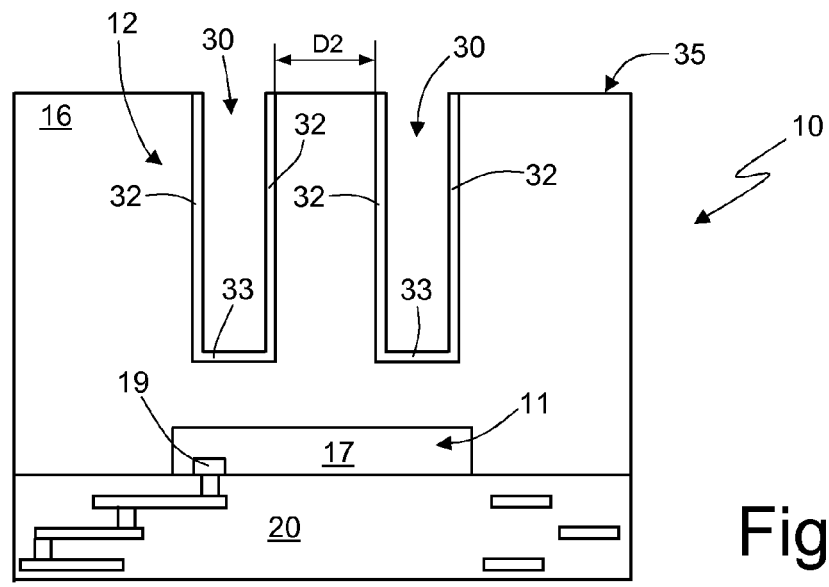
FIGS. 8-10 are cross-sections of semiconductor chips integrating further embodiments of the present magnetic sensor.

FIG. 8 shows a variant of FIG. 5, wherein two trenches 30 extend above the area occupied by the Hall cell 11, within the space delimited by the area of the well 17. In this way, the concentrator 12 comprises four ferromagnetic regions 32, two for each trench 30, all arranged so that their ideal prolongation traverses the well 17, i.e., the regions 32 are all directly above the well 17. This arrangement is obtained by forming the two trenches 30 very close to one another. For example, the distance D2 between the two trenches may be of 15-30 μm.

The structure of FIG. 8 is obtained in the way described with reference to FIGS. 4a-4c, by simultaneously forming the trenches 30 so that all the ferromagnetic regions 32 are obtained starting from the same ferromagnetic layer 45 and have the same length and the same thickness.

In the case of FIG. 8, a greater amplification of the magnetic field that traverses the Hall cell 11 is obtained, thanks to the further widening of the area of high magnetic field.

In general, the principle of providing a number of adjacent ferromagnetic regions 32, so that the lines of flux concentrated by these superpose on a same Hall cell 11, may be extended to obtain a region of high and uniform magnetic field, which is as wide as may be desired. This allows an optimization of the size of the Hall cell 11 irrespective of the concentrator 12, and provides a high field throughout the area of the Hall cell 11. The possibility of sizing the Hall cell 11 without constraints imposed by the concentrator 12 may prove very useful since it has been found experimentally that excessively small Hall-effect sensors show a high and markedly variable offset from one device to another. In addition, small Hall-effect sensors are in general less stable in temperature and noisier than larger ones. Instead, the arrangement of an array of ferromagnetic regions above a Hall cell 11 makes it possible to increase the area of the latter and obtain a high and uniform magnetic field throughout the extension thereof, thus preventing the problems that exist for sensors of small dimensions, that have been referred to above.

Figure 9:
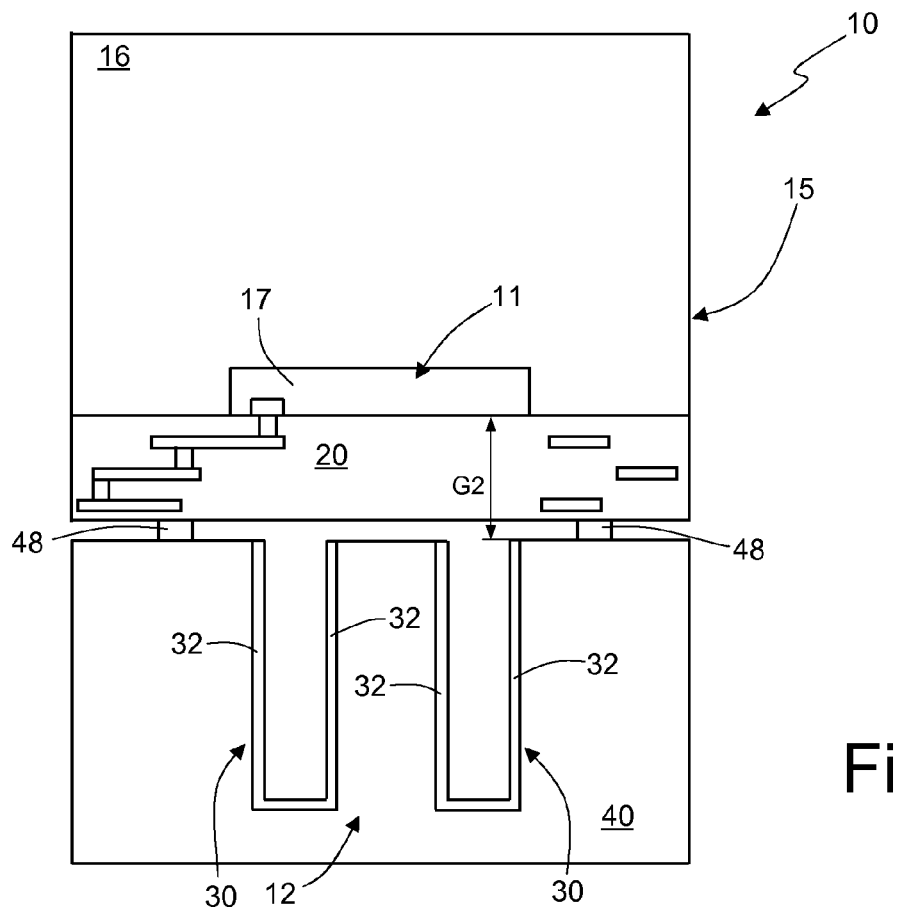

In FIG. 9, the chip 15 is no longer monolithic, but is formed by two substrates bonded to one another, for example, a first substrate 16, accommodating the Hall cell 11 and the electronic components 28, and a second substrate 40, accommodating the concentrator 12. Here, the second substrate 40 may or may not accommodate electronic components and/or be coated by further layers, at least on the face opposed to the first substrate 16. In this case, just the second substrate 40 is subjected to the machining steps illustrated in FIGS. 4a-4c for forming the trenches 30, coating with the ferromagnetic layer 45, and removing the external portions of the ferromagnetic layer 45.

Then, the first substrate 16 and the second substrate 40 are bonded in a known way, for example, by providing bumps 48 on the second substrate 40 or on the dielectric layer 20 on the first substrate 16. The bumps 48 may have, for example, a height of 10 μm. Next, the second substrate 40 and the dielectric layer 20 are moved close to each other so as to align the trenches 30 to the well 17 so that they are contained in the space delimited by the area of the well 17, and pressure/heat is applied, obtaining bonding of the second substrate 40 to the dielectric layer 20, in a per se known manner.

In FIG. 9, the ferromagnetic regions 32 that form the concentrator 12 are at a minimum distance from the well 17 in which the Hall cell 11 is formed. For example, the distance G2 between the mutually facing surfaces of the first substrate and of the second substrate is 10-15 μm.

Figure 10:
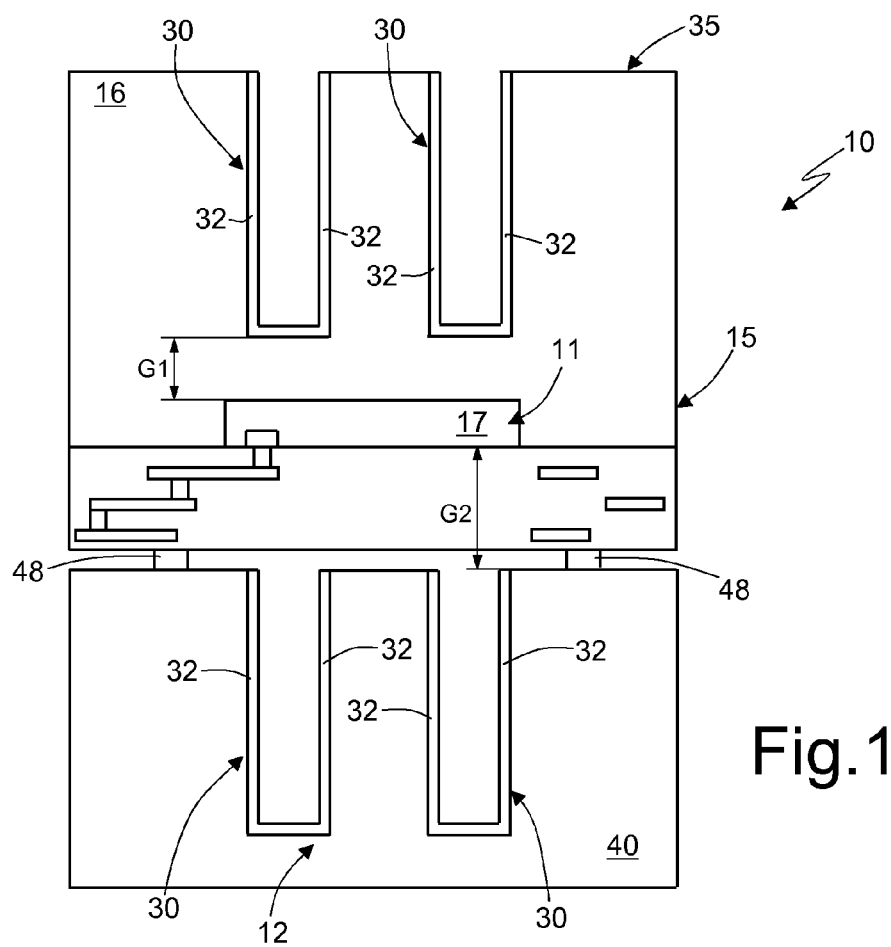

FIG. 10 shows one embodiment wherein the concentrator 12 comprises ferromagnetic regions 32 formed both on the back of the first substrate 16 and on the second substrate 40. Also in this case, the chip 15 is no longer monolithic, but is formed by two substrates 16, 40 bonded to one another. Trenches 30 are provided both in the first substrate 16 and in the second substrate 40; both substrates 16, 40 are covered by the ferromagnetic layer 45, which is removed from the outside of the trenches 30 of both of the substrates. Then the two substrates 16, 40 are bonded in a way similar to what has been described for the embodiment of FIG. 9.

Also here, the distances G1 and G2 are kept to a minimum, for example 10-15 μm.

In FIG. 10, in practice, the concentrator 12 is formed on two levels, and the Hall cell 11 is arranged between pairs of ferromagnetic regions 32 that may or may not be aligned to each other, but the ideal prolongations whereof traverse the well 17.

Figure 11A:
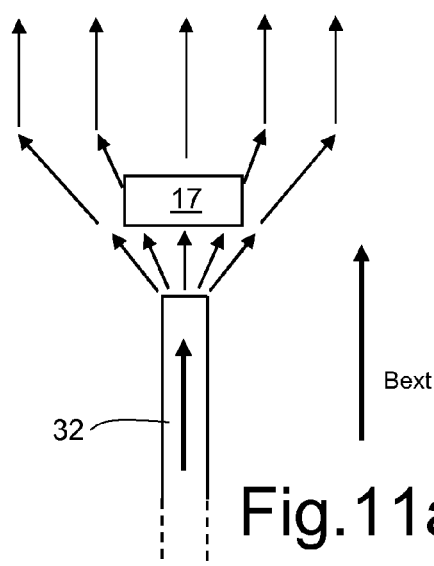
FIGS. 11a and 11b show the plot of the field in two different embodiments of the present magnetic sensor.
Figure 11B:
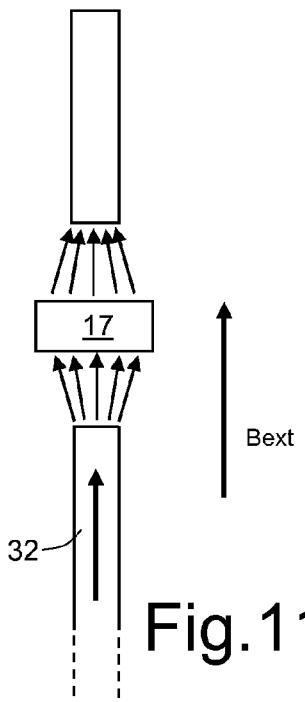

The two-level embodiment has the advantage that the magnetic flux leaving a first level of the concentrator 12 (for example, leaving the ferromagnetic regions 32 arranged under the well 17 in FIG. 10) is collected on the other level of the concentrator 12 (in the case considered, by the ferromagnetic regions 32 above the well 17 in FIG. 10). In this way, the lines of field may not widen out as instead may occur in the case of concentrator 12 provided on a single level, above or under the Hall cells 11, as may be seen by comparing FIG. 11a and FIG. 11b.

In practice, the solution of FIG. 10 has the following advantages:

- the magnetic field is focused on a smaller area of the Hall cell 11 (greater concentration of the lines of flux);
- in the proximity of the well 17, the lines of field are less inclined as compared to the case with concentrator 12 on a single level; thus, here the field extends in a direction closer to the perpendicular to the well 17, i.e., to the direction to which the Hall cell 11 is sensitive;
- it follows that the Hall-effect sensor has an improved sensitivity.

Figure 12:
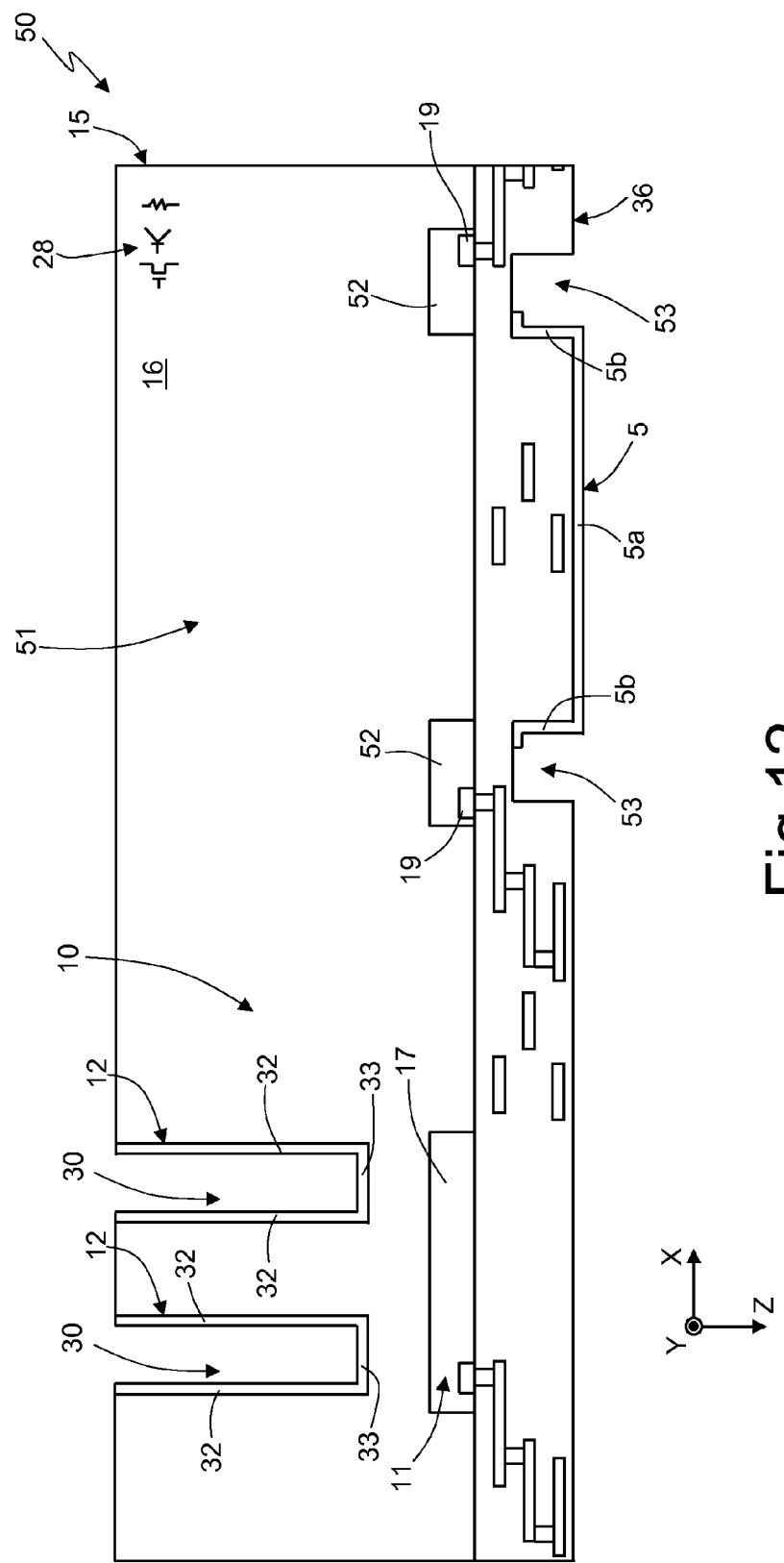
FIGS. 12 and 13 are cross-sections of semiconductor chips integrating both the present vertical magnetic sensor and a horizontal magnetic sensor.
Figure 13:
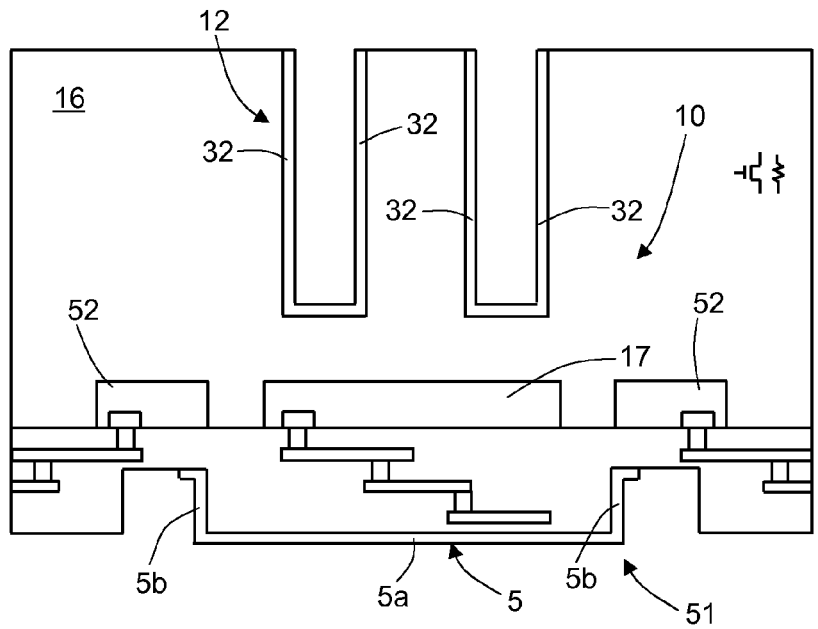

FIGS. 12 and 13 show triaxial magnetic sensors 50, with approximately uniform sensitivity in the three spatial directions. To this end, the vertical Hall-effect sensor 10, which is sensitive to vertical magnetic fields, is obtained in a same chip 15 and in proximity of a horizontal Hall-effect sensor 51, obtained as described in the aforementioned U.S. patent application Ser. No. 12/957,175.

In FIG. 12, the vertical Hall-effect sensor 10 has the structure shown in FIG. 8, but could be obtained according to any of the other embodiments described above. Here, the substrate 16 accommodates, in addition to the well of the vertical sensor 10, designated as "Z well" 17, at least one well for detecting field components directed along axis X, designated as "X well" 52, and a well for detecting field components directed along axis Y (not shown).

The horizontal Hall-effect sensor 51 is laterally offset with respect to the vertical Hall-effect sensor 10, at a distance sufficient to limit the component of field focused thereon by the concentrator for the other Hall-effect sensor. For example, this distance may be comprised between 100 and 500 µm.

In FIG. 12, the horizontal Hall-effect sensor 51 comprises two X wells 52, and two Y wells, which are not visible since they are arranged in front and behind the drawing plane along two lines perpendicular to a line passing through the two X wells 52. The X wells 52 and the Y wells accommodate own conductive biasing and detection regions 19, connected in a known way to electronic components 28 of the circuitry.

The horizontal Hall-effect sensor 51 further comprises a horizontal concentrator 5, which includes a planar portion 5a, parallel to the surface 36 of the chip 15, and tip portions 5b, one for each X well 52 and for each Y well. The planar portion 5a extends above the dielectric layer 20 and has a circular or a cross shape (having a first arm visible in the drawing and a second arm, not visible, which extends perpendicular to the first arm and to the drawing plane), a rhomboidal shape, or the shape of any plane geometrical figure provided with four tip portions 5b. The tip portions 5b extend transversely to the planar portion 5a, for example perpendicular thereto, each from a peripheral portion of the planar portion towards a respective X well 52 or Y well in a respective trench 53. For example, if the planar portion 5a has a cross shape, the tip portions 5b extend starting from the ends of the arms of the cross.

The horizontal concentrator 5 is thin; i.e., it has a thickness much smaller than its other dimensions; in particular the planar portion 5a has a thickness much smaller than its dimensions in a parallel direction to the surface 36 of the chip 15. For example, the thickness of the planar portion 5a may be comprised between 0.5 and 3 µm, its horizontal encumbrance (understood as distance between the two visible tip portions 5b) may be comprised between 50 µm and 2 µm, for example 200-300 µm, and the tips 5b may have a height of between 2 and 10 µm, typically 3-4 µm.

The horizontal concentrator 5 is also made of a "soft" ferromagnetic material, such as a cobalt-based amorphous alloy or else a permalloy.

As indicated above, in presence of a magnetic field parallel to the main face 35 of the chip 15 (i.e., to the plane XY), the planar portion 5a of the horizontal concentrator produces a concentrated field which is bent and guided by the tip portions 5b towards the respective X wells 52 and Y wells (not visible) so as to be detected after being amplified In this way, the triaxial magnetic sensor 50 is able to detect the components of an external magnetic field directed along all three spatial axes X, Y and Z and has a sensitivity of the same order of magnitude in the three spatial directions.

In FIG. 13, the vertical Hall-effect sensor 10 is arranged in the area shielded from the magnetic field components that are coplanar to the main face 35 of the chip 15.

In detail, the Z well 17 is here accommodated in the substrate 16 under the planar portion 5a of the horizontal concentrator 5, between the X wells 52.

Likewise, the trenches 30 are arranged within the space delimited by the external bulk of the planar portion 5a of the horizontal concentrator 5.

By virtue of the shielding in X, Y of the horizontal sensor 51 in the area where the vertical sensor 10 is formed, the crosstalk between the components of the magnetic field is minimized and at the same time a considerable saving of space is obtained.

In both embodiments of the triaxial magnetic sensor, the X wells 52 and the Y wells, not shown, are obtained exactly as the Z well 17; for example, all the X wells 52, Y wells, and Z wells 17 may be formed by simultaneously implanting the same dopant ions, and thus are structurally undistinguishable. Their different sensitivity to magnetic field components directed along different spatial axes is thus only determined by their position with respect to the vertical concentrator 12 or to the horizontal concentrator 5, and by the geometrical characteristics of the concentrators.

Figure 14:
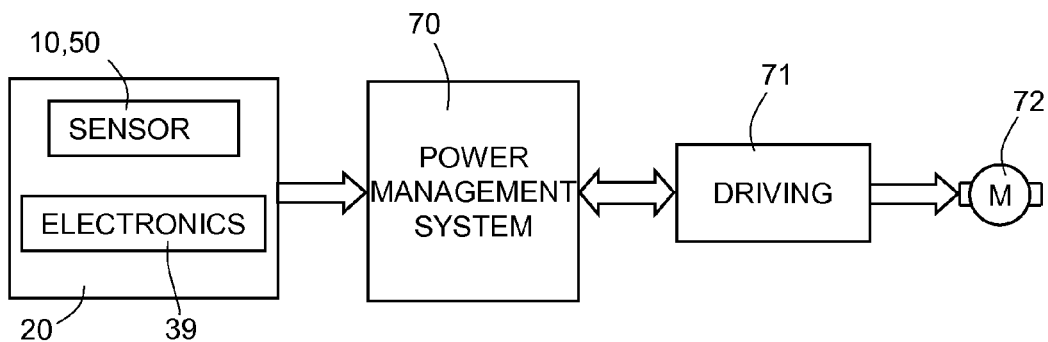
FIGS. 14 and 15 show possible applications of the present magnetic sensor.

The vertical magnetic sensor 10 (possibly inserted in the triaxial magnetic sensor 50) may be used as current sensor in numerous applications, thanks to its high sensitivity in regard to external magnetic fields and to the possibility of being manufactured separately from the components or structures to be monitored. In fact, it does not require its insertion in the detection circuit, thus it has no insertion losses. Consequently, the present integrated magnetic sensor may be used for current detection in power-management systems in the automotive field, for example in electric motors, the levels of consumption whereof are to be controlled, as shown for example in FIG. 14, where the chip 15 integrating the magnetic sensor and the corresponding control and processing circuitry is connected to a power-management unit 70, for example a microprocessor, which co-operates with an electronics 71 for driving an electric motor 72.

Figure 15:
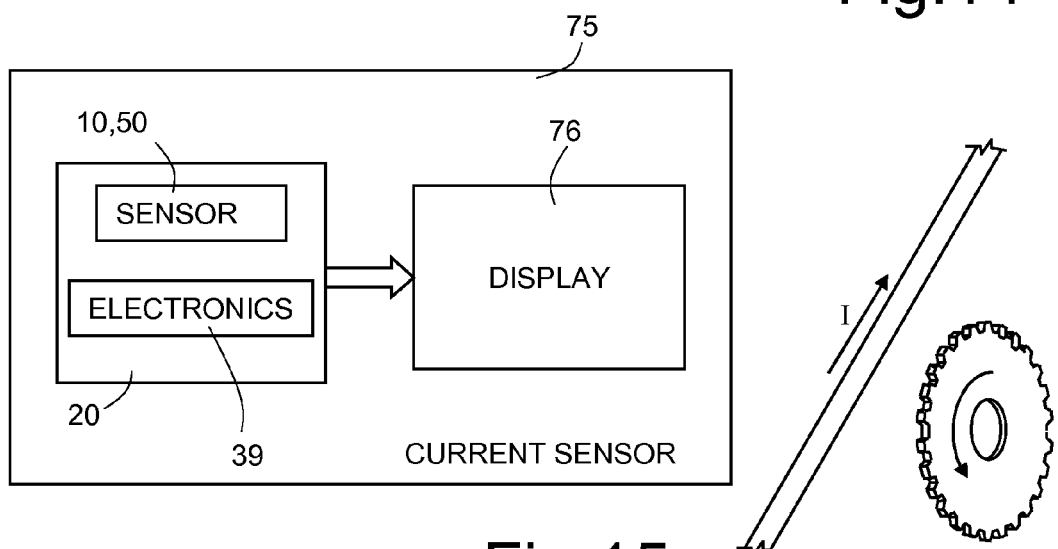

In addition, the present integrated magnetic sensor may be used for evaluating the angle of rotation of north-south magnets or of mechanical members having said magnets, such as wheels, gears, encoders, as shown in FIG. 15, where the chip 15 is connected to a display 75 of a current sensor 76, possibly having further control electronics (not shown).

Finally, the described magnetic sensors may find application in electronic-compass systems, above all in the triaxial configuration.

The integrated magnetic sensors described herein have the following advantages:

1. increase in sensitivity to the component perpendicular to the chip 15;
2. increase in intensity and uniformity of the concentrated field over an area as wide as may be desired of the Hall cell 11, whose dimensions may be chosen as desired, using a plurality of vertical walls 32, arranged to form an array within more trenches 30;
3. further increase in the sensitivity using concentrators 12 on two levels, one above and the other beneath the Hall cell 11;
4. possibility of obtaining a triaxial magnetometer with comparable sensitivity for each of the sensitivity axes;
5. possibility of using Hall-effect sensors of a large area, thus having a lower offset, greater repeatability on the wafer, lower sensitivity of the offset to temperature, as well as lower noise.

Finally, it is clear that modifications and variations may be made to the magnetic sensor and to the corresponding manufacturing process, described and illustrated herein, without thereby departing from the scope of the present disclosure.

For example, the number of trenches 30 overlying the Hall cell 11 may even not be integer, i.e., it may happen that at least one trench 30 is not completely included within the space delimited by the area of the well 17. In this case, the number of ferromagnetic regions 32 arranged within this space is odd and there is a ferromagnetic region 32 external to the space delimited by the area of the well 17, which does not contribute to the concentration effect, but does not have a negative effect.

In addition, the present vertical sensor 10 may be combined with a known horizontal sensor, of the type shown in FIG. 1.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated magnetic sensor comprising:
a body having a main face and including a first substrate of semiconductor material;
a first Hall cell integrated in the first substrate;
a first trench formed in the body and delimited by lateral surface portions extending transversely to the main face, the first trench having a depth in a direction substantially perpendicular to the main face and a width in a direction substantially parallel to the main face, between the lateral surface portions, the width being smaller than the depth; and
a first concentrator of ferromagnetic material, including first and second ferromagnetic regions arranged at a mutual distance from each other and extending along the lateral surface portions of the first trench toward the first Hall cell, wherein the first Hall cell has an area in a direction parallel to the main face of the body and the ferromagnetic regions extended within a right prism having as a base the area of the first Hall cell.

2. An integrated magnetic sensor according to claim 1, wherein the first Hall cell comprises a well of the substrate.

3. An integrated magnetic sensor according to claim 1, wherein a ratio of the width to the depth of the first trench is at most 1:8.

4. An integrated magnetic sensor according to claim 1, wherein the ferromagnetic regions each have a length and a thickness and a ratio of the thickness to the length is at most 1:20.

5. An integrated magnetic sensor according to claim 1, wherein the ferromagnetic regions each have a length equal to the depth of the first trench.

6. An integrated magnetic sensor according to claim 1, comprising a second trench arranged side by side to the first trench and having a lateral surface portion covered by a third ferromagnetic region and extending toward the first Hall cell.

7. An integrated magnetic sensor according to claim 6, wherein the first trench and the second trench are separated from each other by a distance that is of a same magnitude order as said width of the first trench.

8. An integrated magnetic sensor according to claim 1, wherein the first substrate has first and second surfaces, the first surface forms the main face of the body, the first trench is formed in the first substrate from the main face and the first Hall cell faces the second surface.

9. An integrated magnetic sensor according to claim 1, wherein the body comprises a second substrate bonded to the first substrate and the first trench is formed in the second substrate, toward the first Hall cell.

10. An integrated magnetic sensor according to claim 1, wherein the body comprises a second substrate bonded to the first substrate, the first substrate has first and second surfaces, the first surface forms the main face of the body, the first trench is formed in the first substrate from the main face, the first Hall cell faces the second surface and the second substrate accommodates a second trench having lateral surface portions covered by ferromagnetic regions, the ferromagnetic regions covering the lateral surface portions of the second trench extending toward the first Hall cell.

11. An integrated magnetic sensor according to claim 1, comprising:
a second Hall cell integrated in said first substrate side by side to the first Hall cell;
a dielectric layer extending on the first substrate; and
a second concentrator of ferromagnetic material, having a planar portion extending lengthwise on the dielectric layer transversely with respect to the first and second ferromagnetic regions of the first concentrator and a tip protruding peripherally from and transversely to the planar portion toward the second Hall cell, the tip of the second concentrator being laterally offset with respect to the first Hall cell and to the first trench.

12. An integrated magnetic sensor according to claim 1, comprising:
a second Hall cell integrated in said first substrate side by side to the first Hall cell;
a dielectric layer extending on the first substrate; and
a second concentrator of ferromagnetic material, having a planar portion extending lengthwise on the dielectric layer transversely with respect to the first and second ferromagnetic regions of the first concentrator and a tip protruding peripherally from and transversely to the planar portion toward the second Hall cell, wherein the first substrate has first and second surfaces, the first surface forms the main face of the body, the first trench extends in the first substrate from the main face, the dielectric layer extends on the second surface of the first substrate and the second concentrator is arranged directly above or below the first Hall cell.

13. An apparatus comprising:

a controller; and an integrated magnetic sensor coupled to the controller and including:

- a body having a main face and including a first substrate of semiconductor material;
- a first Hall cell integrated in the first substrate;
- a first trench formed in the body and delimited by lateral surface portions extending transversely to the main face, the first trench having a depth in a direction substantially perpendicular to the main face and a width in a direction substantially parallel to the main face, between the lateral surface portions, the width being smaller than the depth; and
- a first concentrator of ferromagnetic material, including first and second ferromagnetic regions arranged at a mutual distance from each other and extending along the lateral surface portions of the first trench toward the first Hall cell, wherein the first Hall cell has an area in a direction parallel to the main face of the body and the ferromagnetic regions extend within a right prism having as a base the area of the first Hall cell.

14. An apparatus according to claim 13, further comprising:

a motor;

a motor driver configured to drive the motor;

a power management system coupled to the motor driver and the magnetic sensor, the magnetic sensor being configured to sense a current of the motor and cause the power management system to cause the motor driver to adjust an operation of the motor.

15. An apparatus according to claim 13, wherein the magnetic sensor is configured to detect a current in an electric structure, the apparatus further comprising:

a current display configured to display a representation of the current detected by the magnetic sensor.

16. An apparatus according to claim 13, wherein the magnetic sensor is configured to detect the magnetic field of the Earth and the controller is configured determine an orientation of the apparatus based on the magnetic field detected by the magnetic sensor.

17. A process for manufacturing an integrated magnetic sensor for detecting an external magnetic field, comprising:

- providing a body having a main face and a first substrate of semiconductor material;
- forming, in the first substrate, a first Hall cell;
- forming, in the body, a trench having a depth in a direction substantially perpendicular to the main face and a width in a direction substantially parallel to the main face, between the lateral surface portions, the width being smaller than the depth;
- depositing a ferromagnetic material layer on the lateral surface portions of the trench, thereby forming a plurality of mutually spaced ferromagnetic regions extending toward the first Hall cell, wherein the first Hall cell has an area in a direction parallel to the main face of the body and the ferromagnetic regions extend within a right prism having as a base the area of the first Hall cell.

18. A process according to claim 17, wherein forming the trench comprises etching the first substrate from the main face of the body through a deep reactive ion etching.

19. A process according to claim 17, wherein the step of forming a trench comprises:

providing a second substrate;

etching the second substrate by a deep reactive ionic etch;

depositing the ferromagnetic material layer on the second substrate; and bonding the first and the second substrates with the trench toward the Hall cell through bump structures.

20. A process according to claim 17, comprising:

forming, simultaneously to the first Hall cell, a second Hall cell in said first substrate, side by side to the first Hall cell;

forming a dielectric layer on the first substrate; and forming a concentrator of ferromagnetic material, having a planar portion on the dielectric layer and a tip protruding peripherally from and transversally to the planar portion toward the second Hall cell, said concentrator being laterally offset with respect to the first Hall cell or positioned directly above or below the first Hall cell.

* * * * *